US012445773B2

(12) United States Patent
Barefoot

(10) Patent No.: US 12,445,773 B2
(45) Date of Patent: Oct. 14, 2025

(54) METHOD AND APPARATUS FOR REDUCING REACTION FORCES IN LOUDSPEAKERS

(71) Applicant: Barefoot Sound, LLC, Los Angeles, CA (US)

(72) Inventor: Thomas Barefoot, Portland, OR (US)

(73) Assignee: Barefoot Sound, LLC, Los Angeles, CA (US)

( * ) Notice: Subject to any disclaimer, the term of this patent is extended or adjusted under 35 U.S.C. 154(b) by 260 days.

(21) Appl. No.: 18/365,100

(22) Filed: Aug. 3, 2023

(65) Prior Publication Data

US 2024/0048907 A1 Feb. 8, 2024

Related U.S. Application Data

(60) Provisional application No. 63/370,453, filed on Aug. 4, 2022.

(51) Int. Cl.

| | |
|---|---|
| ***H04R 3/02*** | (2006.01) |
| ***H03F 3/45*** | (2006.01) |
| ***H04R 3/08*** | (2006.01) |
| ***H04R 29/00*** | (2006.01) |

(52) U.S. Cl.

CPC ................. *H04R 3/02* (2013.01); *H04R 3/08* (2013.01); *H04R 29/001* (2013.01); *H03F 3/45475* (2013.01); *H03F 2200/03* (2013.01)

(58) Field of Classification Search

CPC .......... H04R 3/02; H04R 3/08; H04R 29/001; H03F 3/45475; H03F 2200/03

See application file for complete search history.

(56) References Cited

U.S. PATENT DOCUMENTS

| | | | |
|---|---|---|---|
| 4,176,249 A | 11/1979 | Inanaga et al. | |
| 6,373,956 B1 * | 4/2002 | Varla ...................... | H04R 3/002 181/208 |
| 7,551,749 B2 | 6/2009 | Rosen et al. | |
| 8,180,076 B2 | 5/2012 | Bastyr et al. | |
| 2010/0246848 A1 | 9/2010 | Stanley | |
| 2016/0192075 A1 | 6/2016 | Shibata et al. | |
| 2018/0351547 A1 | 12/2018 | Chawla | |
| 2019/0335278 A1 | 10/2019 | Gong et al. | |

OTHER PUBLICATIONS

International Search Report and Written Opinion of the International Searching Authority dated Nov. 6, 2023, in connection with International Application No. PCT/US2023/029433, 6 pages.

* cited by examiner

*Primary Examiner* — Andrew Sniezek

(57) ABSTRACT

A method and apparatus are provided for reducing reaction forces in loudspeakers. The method includes providing, from a power source (312) connected to a loudspeaker (304), a current to the loudspeaker. The method also includes measuring, using a current sense resistance (308) connected in series to the loudspeaker, the current through the loudspeaker. The method further includes providing, using a voltage-controlled source (310) connected in series to the loudspeaker, a current substantially proportional to the measured current through the loudspeaker to an actuator (306), wherein the actuator is connected in series to the loudspeaker.

20 Claims, 12 Drawing Sheets

METHOD AND APPARATUS FOR REDUCING REACTION FORCES IN LOUDSPEAKERS

CROSS-REFERENCE TO RELATED APPLICATIONS AND PRIORITY CLAIMS

This application claims priority under 35 U.S.C. § 119(e) to U.S. Provisional Patent Application No. 63/370,453 filed on Aug. 4, 2022, which is hereby incorporated by reference in its entirety.

TECHNICAL FIELD

The present invention relates generally to improving loudspeaker devices and methods, and more particularly to methods for reducing reaction forces in loudspeakers by using a voltage-controlled current source to drive an actuator that is in series with a motor assembly used to generate a force on a diaphragm, as well as an active loudspeaker apparatus employing those methods.

BACKGROUND

Following Newton's 3$^{rd}$ Law of motion, the diaphragm exerts an equal and opposite reaction force on the motor assembly. This vibrational reaction force is also transmitted to air via a mechanical coupling of the loudspeaker frame and enclosure assembly. These unwanted vibrations and the resulting sound waves have a deleterious effect on sound that is intentionally transmitted by the speaker diaphragm. Therefore, it is desirable to reduce or eliminate the reaction force vibrations.

BRIEF SUMMARY OF THE INVENTION

This disclosure provides methods and apparatus for reducing reaction forces in loudspeakers. A motor of a loudspeaker creates an acoustic force on a diaphragm to produce audio, which has an undesirable side effect of a reaction force in an opposite direction that degrades sound quality of the audio. An actuator is connected to a loudspeaker in a manner that the actuator creates an actuator force on a mass that produces a response force in an opposite direction of the reaction force. In order to properly activate the actuator in a manner for the reaction force to counter the response force, the actuator is applied in series to the loudspeaker. A sense resistor and power controlled current source are installed after the loudspeaker and designed to provide a current to the actuator that is proportional to the current passing through the loudspeaker.

In a first embodiment, a method for reducing reaction forces in loudspeakers includes providing, from a power source connected to a loudspeaker, a current to the loudspeaker. The method also includes measuring, using a current sense resistance connected in series to the loudspeaker, the current through the loudspeaker. The method further includes providing, using a voltage-controlled source connected in series to the loudspeaker, a current proportional to the measured current through the loudspeaker to an actuator, wherein the actuator is connected in series to the loudspeaker.

In a second embodiment, an apparatus for reducing reaction forces in loudspeakers includes a loudspeaker, an actuator, a power source, and a current sense resistance. The actuator is connected in series with the loudspeaker. The power source is connected to the loudspeaker to provide a current to the loudspeaker, and a current sense resistance connected in series to the loudspeaker to measure a current through the loudspeaker. The voltage-controlled source is connected in series to the loudspeaker to provide a current proportional to the measured current through the loudspeaker to the actuator.

In some embodiments, the voltage-controlled source is in parallel to the current sense resistance.

In some embodiments, the voltage-controlled source includes a current sense level potentiometer providing a voltage drop proportional to a voltage caused by a current through the loudspeaker. The current sense level potentiometer has a resistance at least one order of magnitude higher than the current sense resistance.

In some embodiments, the voltage-controlled source includes a low pass filter filtering high frequency transients of the voltage drop across the current sense level potentiometer. The low pass filter can be formed by a low pass filter resistor and a low pass filter capacitor.

In some embodiments, the voltage-controlled source includes a current source operational amplifier providing an output current proportional to the voltage across the current sense resistance. The low pass filter is connected to a non-inverting input of the current source operational amplifier. An inverting terminal of the current source operational amplifier is connected to an actuator current sense resistor. A factor for the output current proportional to the voltage across the current sense resistance is determined by a resistance of the actuator current sense resistor.

In some embodiments, the voltage-controlled source includes an actuator power amplifier amplifying the output current to produce the current that is suitable for driving the actuator.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description taken in conjunction with the accompanying drawings, in which like reference numerals represent like parts.

The use of the same reference symbols in different drawings indicates similar or identical items.

DETAILED DESCRIPTION OF THE INVENTION

FIGS. 1 through 11, described below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
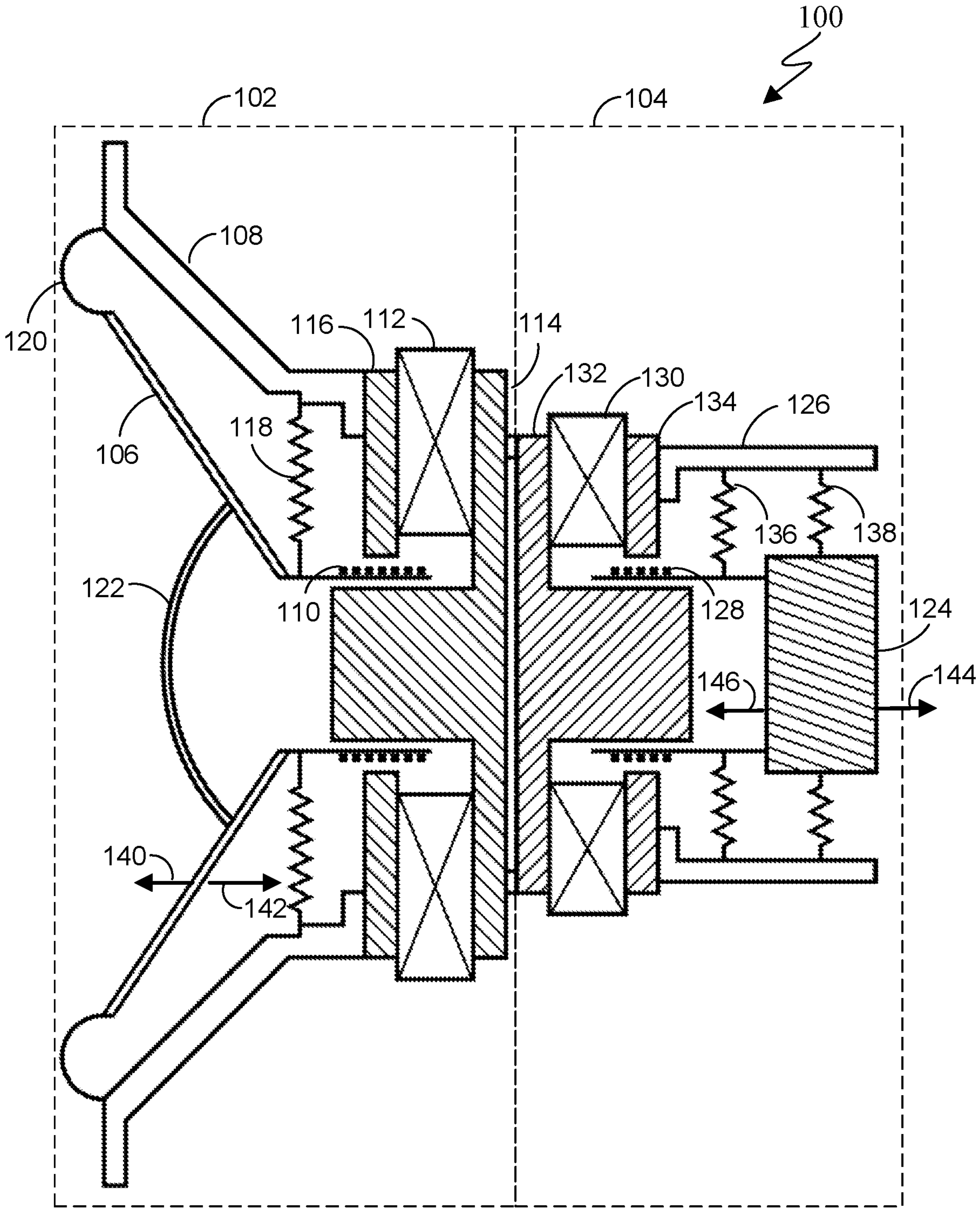
FIG. 1 illustrates a schematic diagram of a loudspeaker for eliminating reaction forces by attaching an electromechanical actuator to a speaker motor assembly.

FIG. 1 illustrates a schematic diagram of a loudspeaker 100 for eliminating reaction forces by attaching an electromechanical actuator to a speaker motor assembly. The embodiment of the loudspeaker 100 illustrated in FIG. 1 is for illustration only. FIG. 1 does not limit the scope of this disclosure to any particular implementation of a loudspeaker.

A dynamic loudspeaker 100 can include an acoustic assembly 102 and a reaction assembly 104. The reaction assembly 104 can also be referred to as an actuator. The acoustic assembly 102 includes components of the loudspeaker 100 used to produce an audio output. The acoustic assembly 102 can include a diaphragm 106, a basket 108, a voice coil 110, an acoustic magnet 112, an acoustic yoke 114, acoustic front plate 116, a spider 118, a surround 120, and a cap 122.

The dynamic loudspeaker 100 works by exerting an acoustic force 140 on the diaphragm 106 which excites acoustic waves in a medium such as the air. The diaphragm 106 operates as a transducer to convert mechanical vibrations to sounds or acoustic vibrations. The diaphragm 106 can be connected at a first end to the basket 108 and at a second end to a voice coil 110. Stiffness and damping characteristics of the diaphragm 106 largely determine an accuracy of sound waves generated. The diaphragm 106 can be formed from any suitable material(s). In some embodiments, the diaphragm 106 can be formed from paper, paper composites and laminates, plastic materials, or other material(s) that can produce acoustic vibrations from mechanical vibrations.

The basket 108 is a frame that provides a support structure for the loudspeaker 100. The basket 108 is attached to a speaker case or other structural component in which the loudspeaker 100 is installed. The components of the loudspeaker 100 are mounted to the basket 108. The basket 108 provides a rigid structure that is made with a high degree of precision for all the components of the loudspeaker 100 to align properly. The basket 108 can provide additional functionality, such as heat dissipation from other components. The basket 108 can be made of any suitable material(s) for minimizing additional vibration cause by the diaphragm 106. In some embodiments, the basket 108 can be formed from stamped steel, cast aluminum, plastic, or other material (s) that can properly be designed for proper alignment of the other components of the loudspeaker 100 and also minimize vibration in the basket 108 due to the connection with the diaphragm 106.

The voice coil 110 is a coil of wire that receives an alternating flowing current of an audio signal which creates an electromagnetic field through the voice coil 110. The electromagnetic field of the voice coils 110 counters a permanent magnetic field created by the acoustic magnet 112. The countering of the permanent magnetic field by the electromagnetic field causes vibration in the voice coil 110 and the diaphragm 106. The acoustic force 140 exerted on the diaphragm 106 is generated by a motor assembly that passes current through the voice coil 110 situated in a static magnetic field generated by the acoustic magnet 112. The acoustic force 140 exerted on the diaphragm 106 is equal to the current in the voice coil 110 times the magnetic field strength generated by the acoustic magnet 112 times the length of voice coil 110 within the magnetic field, where the acoustic force 140 can be represented as follows:

$$F=iBL \tag{1}$$

where F represents an acoustic force 140 applied to the diaphragm 106, i represents a current in the voice coil 110, B represents a magnetic field strength generated by the acoustic magnet 112, and L represents a length of the voice coil 110.

While a single voice coil 110 is described, multiple voice coils 110 could be implemented in the loudspeaker 100 for providing various wiring options and providing an ability of simultaneously connecting two different signals. Note that while the voice coil 110 is described as being underhung, the voice coil 110 may be integrated as overhung in the loudspeaker 100. Underhung voice coils 110 can provide a more linear motor strength over an excursion range at a higher cost than overhung voice coils 110. The voice coil 110 can be formed of any suitable material for creating a wire that converts an alternating flowing current into an electromagnetic field. In some embodiments, the voice coil 110 can be formed of copper, aluminum, or any other material(s) that converts an alternating current into an electromagnetic field.

The acoustic magnet 112, acoustic yoke 114, and acoustic front plate 116 cumulatively generate the permanent static magnetic field. The acoustic magnet 112 provides a stationary magnetic field to oppose the alternating electromagnetic field of the voice coil 110. As discussed above, the opposing fields cause the diaphragm 106 to move inward and outward. The acoustic magnet 112 can be any shape and size. In certain embodiments the acoustic magnet 112 can be in a ring shape. The acoustic magnet 112 can be made of any suitable material(s). In some embodiments, the acoustic magnet 112 can be made from a ferrous ceramic material or other material(s) for generating a stationary magnetic field.

The acoustic yoke 114 can have a back plate portion and a center pole portion. The center pole portion of the acoustic yoke 114 and the acoustic front plate 116 can form a gap of a magnetic circuit. The back plate portion of the acoustic yoke 114 and the acoustic front plate 116 are attached on opposite sides of the acoustic magnet 112. In some embodiments a ferrofluid can be included in the gap for additional cooling and resonance damping of the voice coil 110. The acoustic yoke 114 and the acoustic front plate 116 can also aid in dissipating heat away from the voice coil 110. The acoustic yoke 114 and acoustic front plate 116 can be formed of any suitable material(s). In some embodiments, the acoustic yoke 114 and the acoustic front plate 116 can be formed of iron or other suitable permeable material(s) to form a magnet circuit with the acoustic magnet 112. The acoustic yoke 114 and the acoustic front plate 116 can be formed of the same material or different materials.

The spider 118 and the surround 120 collectively form a suspension for the diaphragm 106. The spider 118 connects between an inner side of the diaphragm 106 and the basket 108. The surround 120 connects between an outside side of the diaphragm 106 and the basket 108. The suspension centers the voice coil 110 in the gap of the magnetic circuit in both the axial and radial directions. The suspension provides a restoring force to maintain a position of the voice coil 110 in the gap, limiting undesirable movement of the diaphragm 106 and the voice coil 110. The spider 118 can be made of any suitable material(s) manufactured to not encourage movement in any one direction and provide homogenous movement of the voice coil 110. In some embodiments, the spider 118 can be formed of a fabric impregnated with a stiffening resin or other suitable material(s) that favor controlled damping. The surround 120 can be formed as part of the diaphragm 106 or as a separate component. In embodiments where the surround 120 is a separate component, the surround 120 can be formed of a same or similar material(s) as the diaphragm 106 or can be formed of different material(s) that would provide suitable suspension of the diaphragm 106.

The cap 122 covers a center opening of the diaphragm 106. The cap 122 prevents dust and dirt from entering the gap of the magnetic circuit. The cap 122 can add strength to the diaphragm 106 while also helping to maintain a shape of the diaphragm 106. The added mass of the cap 122 can lower a driver resonance. In certain embodiments, the cap 122 can include a screen or vent to allow airflow for additional cooling of the voice coil 110. The cap 122 can be formed as either convex or concave. The cap 122 can be formed of any suitable material(s). In certain embodiments, the cap 122 is formed of the same material(s) as the diaphragm 106.

When the acoustic force 140 is applied to the diaphragm 106, a reaction force 142 is applied in an opposite direction. As discussed previously, the reaction force 142 can cause undesirable vibrations that may decrease a quality of the sound produce by the diaphragm 106. The reaction assembly 104 generates a response force 146 to counter the reactive force 142. The reaction assembly 104 can include a mass 124, supporting plates 126, a reactive coil 128, a reactive magnet 130, a reactive yoke 132, a reactive front plate 134, a first mass dampeners 136, and a second mass dampeners 138.

The reaction assembly 104 generates an actuator force 144 that cancels a reactive force generated by a loudspeaker motor generating by moving a mass 124 having a small surface area compared to the moving diaphragm 106. The mass 124 is moved in the opposite direction of the diaphragm 106 with the intention of canceling out the reaction force 142 exerted by the diaphragm 106 on the motor. The mass 124 can be connected at a first end to the supporting plates 126 and at a second end to a reactive coil 128. Characteristics of the mass 124 are designed to produce a response force 146 that equals the reaction force 142 produced. The mass 124 can be formed from any suitable material(s). In some embodiments, the mass 124 can be formed from iron or lead, or other material(s) that can have a large specific gravity in order to enhance prevention of sounds from the mass 124.

The supporting plates 126 is a frame that provides a support structure for the reaction assembly 104. The supporting plates 126 is attached to a speaker case, basket 108, or other structural component in which the loudspeaker 100 is installed. The components of the reaction assembly 104 are mounted to the supporting plates 126. The supporting plates 126 provides a rigid structure that is made with a high degree of precision for all the components of the loudspeaker 100 to align properly. The supporting plates 126 can provide additional functionality, such as heat dissipation from other components. The supporting plates 126 can be made of any suitable material(s) for minimizing additional vibration cause by the mass 124. In some embodiments, the supporting plates 126 can be formed from stamped steel, cast aluminum, plastic, or other material(s) that can properly be designed for proper alignment of the other components of the loudspeaker 100 and also minimize vibration in the supporting plates 126 due to the connection with the mass 124. The supporting plates 126 can be formed of the same material or a different material as the basket 108.

The reactive coil 128 is a coil of wire that receives an alternating flowing current of an audio signal which creates an electromagnetic field through the reactive coil 128. The electromagnetic field of the reactive coil 128 counters a permanent magnetic field created by the reactive magnet 130. The countering of the permanent magnetic field by the electromagnetic field causes vibration in the reactive coil 128 and the mass 124. The actuator force 144 exerted on the mass 124 is generated by a motor assembly that passes current through the reactive coil 128 situated in a static magnetic field generated by the reactive magnet 130. The acoustic force 140 exerted on the mass 124 is equal to the current in the reactive coil 128 times the magnetic field strength generated by the reactive magnet 130 times the length of reactive coil 128 within the magnetic field, where the actuator force 144 can be represented as follows:

$$F_a = i_r B_r L_r \qquad (2)$$

where $F_a$ represents an actuator force 144 applied to the mass 124, $i_r$ represents a current in the reactive coil 128, $B_r$ represents a magnetic field strength generated by the reactive magnet 130, and $L_r$ represents a length of the reactive coil 128.

While a single reactive coil 128 is described, multiple reactive coils 128 could be implemented in the reaction assembly 104 for providing various wiring options and providing an ability of simultaneously connecting two different signals. Note that while the reactive coil 128 is described as being underhung, the reactive coil 128 may be integrated as overhung in the loudspeaker 100. The reactive coil 128 can be formed of any suitable material for creating a wire that converts an alternating flowing current into an electromagnetic field. In some embodiments, the reactive coil 128 can be formed of copper, aluminum, or any other material(s) that convert an alternating current into an electromagnetic field. The reactive coil 128 can be formed from the same or different material as the voice coil 110.

The reactive magnet 130, reactive yoke 132, and reactive front plate 134 cumulatively generate the permanent static magnetic field for the reaction assembly 104. The reactive magnet 130 provides a stationary magnetic field to oppose the alternating electromagnetic field of the reactive coil 128. As discussed above, the opposing fields cause the mass 124 to move inward and outward. The reactive magnet 130 can be any shape and size. In certain embodiments the reactive magnet 130 can be in a ring shape. The reactive magnet 130 can be made of any suitable material(s). In some embodiments, the reactive magnet 130 can be made from a ferrous ceramic material or other material(s) for generating a stationary magnetic field. The reactive magnet 130 can be formed from the same or different material(s) and shape as the acoustic magnet 112.

The reactive yoke 132 can have a back plate portion and a center pole portion. The center pole portion of the reactive yoke 132 and the reactive front plate 134 can form a gap of a magnetic circuit. The back plate portion of the reactive yoke 132 and the reactive front plate 134 are attached on opposite sides of the reactive magnet 130. In some embodiments, the reactive yoke 132 can be formed and integrated into a unified body with the acoustic yoke 114 In some embodiments a ferrofluid can be included in the gap for additional cooling and resonance damping of the voice coil 110. The reactive yoke 132 and the reactive front plate 134 can also aid in dissipating heat away from the reactive coil 128. The reactive yoke 132 and reactive front plate 134 can be formed of any suitable material(s). In some embodiments, the reactive yoke 132 and the reactive front plate 134 can be formed of iron or other suitable permeable material(s) to form a magnetic circuit with the reactive magnet 130. The reactive yoke 132 and the reactive front plate 134 can be formed of the same material or different materials. The reactive yoke 132 and the reactive front plate 134 can be respectively formed of the same or different material(s) and shape(s) as the acoustic yoke 114 and the acoustic front plate 116.

The first mass dampeners 136 and the second mass dampeners 138 collectively form a suspension for the mass 124. The first mass dampeners 136 connects between an inner side of the mass 124 and the supporting plates 126. The second mass dampeners 138 connects between an outside side of the mass 124 and the supporting plates 126. The suspension centers the reactive coil 128 in the gap of the magnetic circuit in both the axial and radial directions. The suspension provides a restoring force to maintain a position of the reactive coil 128 in the gap, limiting undesirable movement of the mass 124 and the reactive coil 128. The first mass dampeners 136 can be made of any suitable material(s) manufactured to not encourage movement in any one direction and provide homogenous movement of the reactive coil 128. In some embodiments, the first mass dampeners 136 can be formed of a fabric impregnated with a stiffening resin or other suitable material(s) that favor controlled damping. The second mass dampeners 138 can be formed as part of the mass 124 or as a separate component. In embodiments where the second mass dampeners 138 is a separate component, the second mass dampeners 138 can be formed of a same or similar material(s) as the mass 124 or can be formed of different material(s) that would provide suitable suspension of the mass 124. The first mass dampeners 136 and the second mass dampeners 138 can be formed of the same or different material(s) as the spider 118.

Although FIG. 1 illustrates an example loudspeaker 100 for eliminating reaction forces by attaching an electromechanical actuator, various changes may be made to FIG. 1. For example, the number and placement of various components of the loudspeaker 100 can vary as needed or desired. In addition, the loudspeaker 100 may be used in any other suitable loudspeaker process and is not limited to the specific processes described above.

Figure 2A:
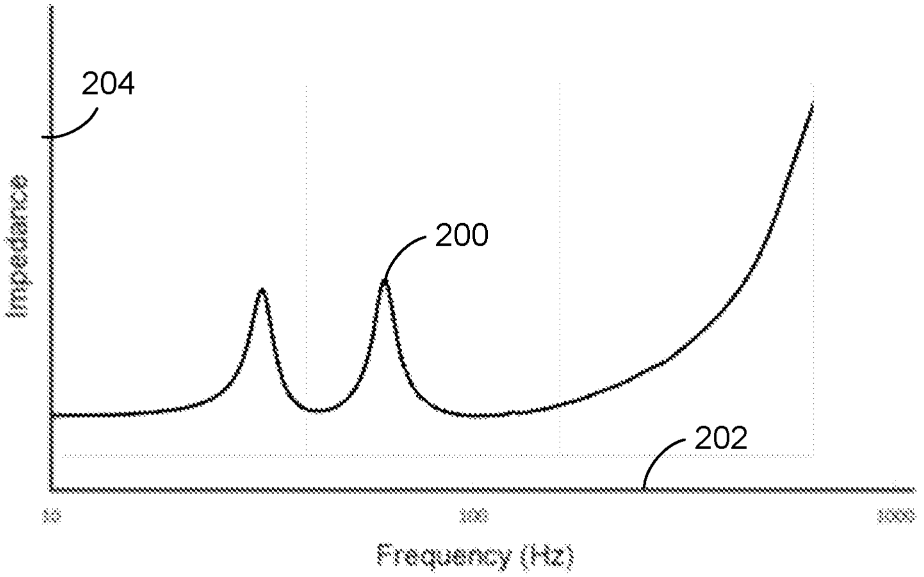
FIG. 2A illustrates an exemplary graph showing the impedance response of a bass reflex loudspeaker system according to embodiments of the present disclosure.
Figure 2B:
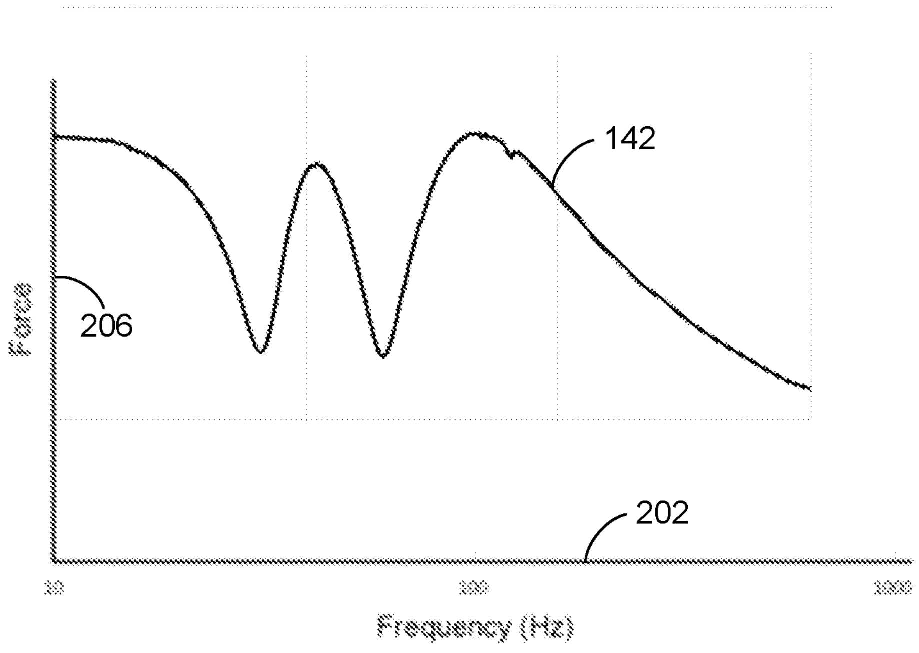
FIG. 2B illustrates an exemplary graph showing a force response of a bass reflex loudspeaker system according to embodiments of the present disclosure.

FIG. 2A illustrates an exemplary graph showing the impedance response 200 of a bass reflex loudspeaker system according to embodiments of the present disclosure. FIG. 2B illustrates an exemplary graph showing a reaction force 142 of a bass reflex loudspeaker system according to embodiments of the present disclosure. The embodiments of the impedance response 200 illustrated in FIG. 2A and the reaction force 142 illustrated in FIG. 2B are for illustration only. FIGS. 2A and 2B do not limit the scope of this disclosure to any particular implementation of a loudspeaker.

In order for the reaction assembly 104 to be effective at vibration cancelation, the instantaneous acoustic force 140 exerted on the diaphragm 106 must be tracked. The determination of the acoustic force 140 results from the complex arrangement of the entire loudspeaker 100 which includes the magnetic field strength of the acoustic assembly 102, the length of voice coil 110 within the magnetic field, mass of the diaphragm 106, back EMF, suspension compliance, compliance of the air in the acoustic assembly 102, mechanical damping, etc. The complexity of the system is reflected in the example of a bass reflex loudspeaker impedance response 200 illustrated in FIGS. 2A and 2B.

The force (F) 206 exerted on the diaphragm 106 is proportional to the current (i) in the voice coil 110. According to Ohm's Law, the current is inversely proportional to the impedance (z) 204, which can be represented as follows:

$$F \propto \frac{BL}{z} \quad (3)$$

where F represents the force 206, B represents a magnetic field strength, L represents a length of the voice coil 110 within the magnetic field, and z represents an impedance 204. Therefore, the acoustic force 140 exerted on the diaphragm 106 is a complicated function of the frequency 202. The reaction force 142 has a substantially equal magnitude as the acoustic force 140 in an opposite direction.

To effectively cancel the reaction force 142 with the response force 146, the actuator force 144 must have the same frequency response as the acoustic force 140 of the loudspeaker 100. Tuning the electro-mechanical parameters of actuator mechanism in a manner that the response force 146 is substantially similar to the reaction force 142 is difficult. If the reaction force 142 of the acoustic assembly 102 is substantially different from the response force 146 of the reaction assembly 104, the response force 146 caused by motion of the reaction assembly 104 may increase vibrations caused by the reaction force 142 rather than reduced or cancelled. Furthermore, as the loudspeaker 100 can be mounted in different enclosures, the acoustic force 140 and the actuator force 144 can be altered in different manners. For example, a sealed enclosure has a very difference force response than a bass reflex enclosure, which means that the electro-mechanical parameters of reaction assembly 104 would need to be tuned differently for every different acoustic assembly 102 and every different enclosure. Tuning the loudspeaker 100 differently based on application requires a great deal of engineering resources, application specialization, and does not lend itself to high volume manufacturing.

Although FIGS. 2A and 2B illustrate an example exemplary graph showing the impedance response 200 of a bass reflex loudspeaker system, various changes may be made to FIGS. 2A and 2B. For example, the dimensions of the impedance response 200 and the response force 146 and their individual components can vary as needed or desired.

Figure 3A:
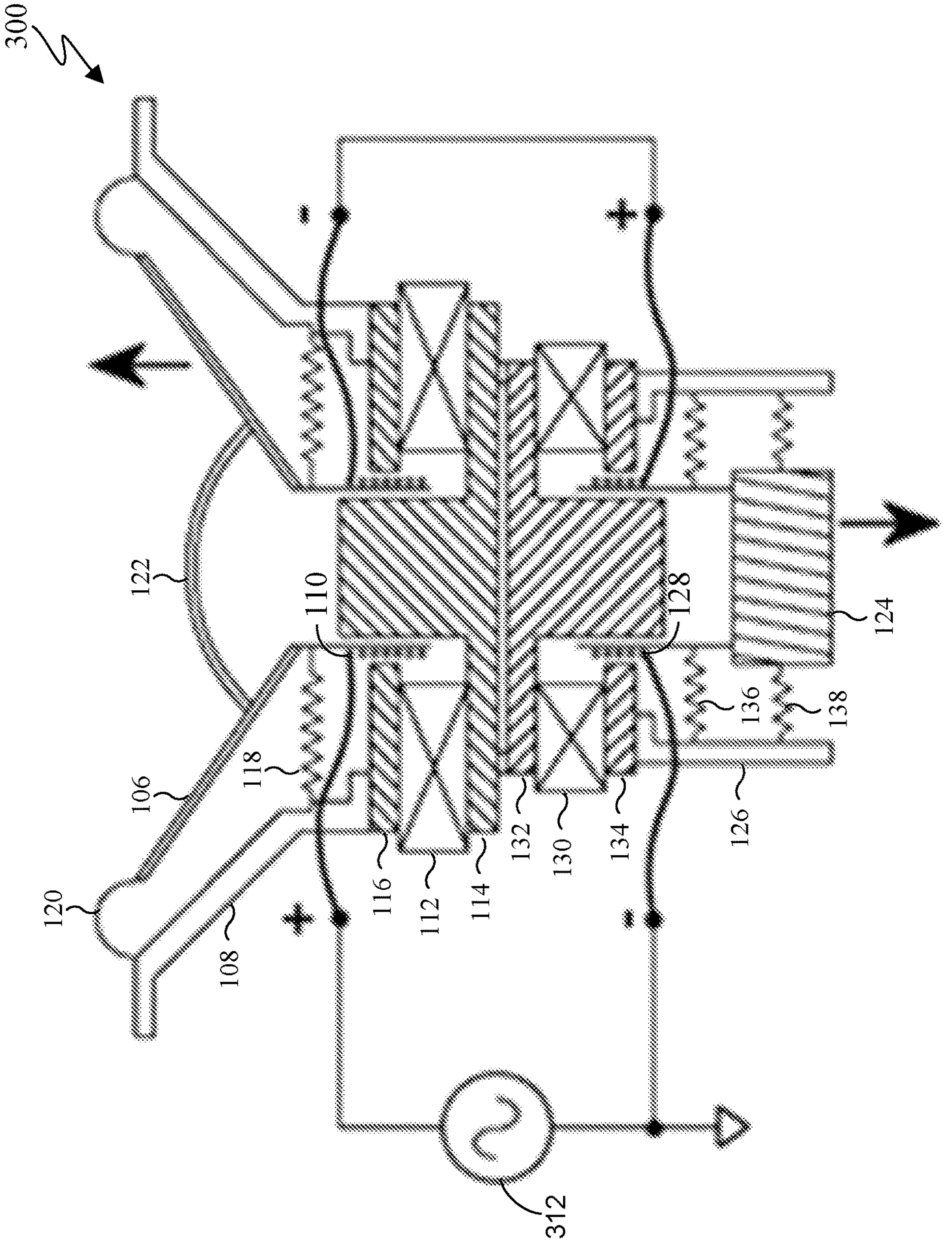
FIG. 3A illustrates an exemplary diagram for a loudspeaker with an actuator driven in series according to embodiments of the present disclosure.
Figure 3B:
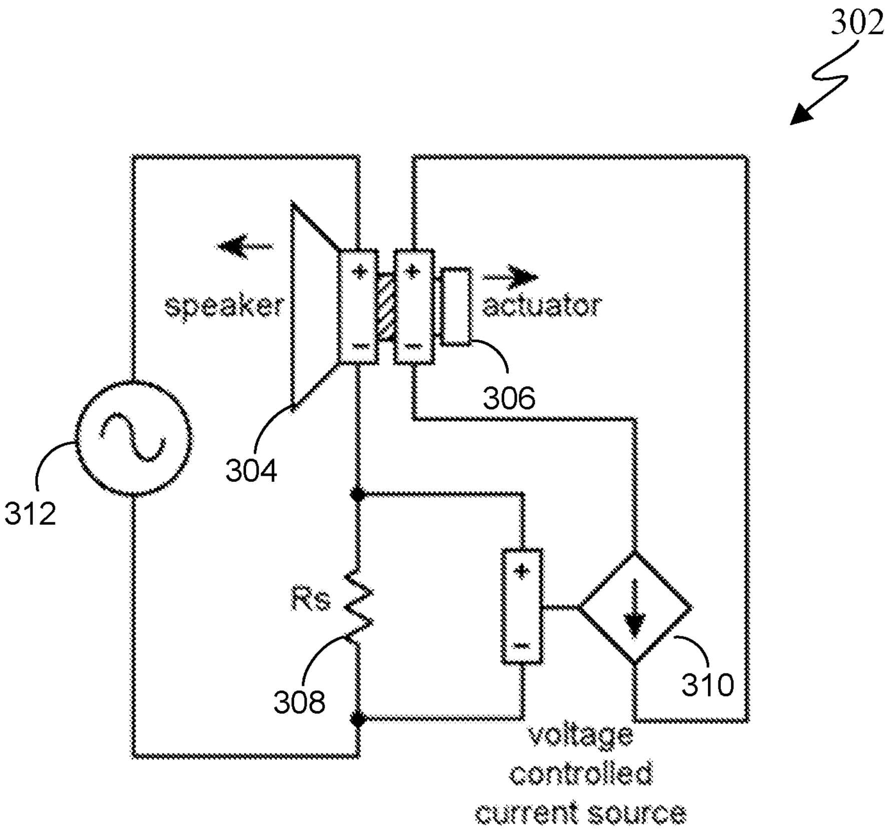
FIG. 3B illustrates an exemplary schematic of a loudspeaker for reducing reaction forces in loudspeakers according to embodiments of the present disclosure.

FIG. 3A illustrates an exemplary diagram for a loudspeaker assembly 300 with an actuator driven in series according to embodiments of the present disclosure. FIG. 3B illustrates an exemplary schematic 302 of a loudspeaker assembly 300 for reducing reaction forces in loudspeakers. The embodiments of the loudspeaker assembly 300 illustrated in FIG. 3A and the schematic 302 of the loudspeaker assembly 300 are for illustration only. FIGS. 3A and 3B do not limit the scope of this disclosure to any particular implementation of a loudspeaker. For simplicity, the active components driving the functions of the acoustic assembly 102 will be referred to as loudspeaker 304 and the active component driving the functions of the reaction assembly 104 will be referred to as actuator 306.

The tuning issue, discussed in detail above in regard to FIGS. 2A and 2B, can be reduced a degree by a power source 312 driving the actuator 306 in series with the loudspeaker 304. A current in the loudspeaker 304 and the actuator 306 are necessarily the same in a series configuration, which translate to proportional forces by the loudspeaker 304. A significant downside to this configuration is that the actuator impedance forms a voltage divider with the loudspeaker impedance. As a result, the actuator impedance alters the frequency response of the loudspeaker 304. Furthermore, nonlinearities in the actuator 306 are reflected in an impedance response 200 of the actuator 306, where the actuator nonlinearities will be translated to the acoustic force 140 output by the loudspeaker 304.

To overcome the difficulties listed above, the current through the loudspeaker 304 is directly measured and a proportional drive current is provided to the actuator 306. The force supplied by the actuator 306 is independent of the actuator's own impedance response 200. The system is described schematically in FIG. 3B.

The sense resistor Rs 308 has a resistance substantially smaller than the lowest impedance of the loudspeaker 304. The voltage across sense resistor Rs 308 is proportional to the current through the loudspeaker 304. The voltage across sense resistor Rs 308 drives a voltage controlled current source 310. The voltage controlled current source 310 produces a current that drives the actuator 306. The actuator drive current is proportional to the current through the loudspeaker 304 and is independent of the impedance of the actuator 306.

Although FIGS. 3A and 3B illustrate an example loudspeaker assembly 300 and schematic 302, various changes may be made to FIGS. 3A and 3B. For example, the number and placement of various components of the loudspeaker assembly 300 and schematic 302 can vary as needed or desired. In addition, the loudspeaker assembly 300 and schematic 302 may be used in any other suitable loudspeaker process and is not limited to the specific processes described above.

Figure 4:
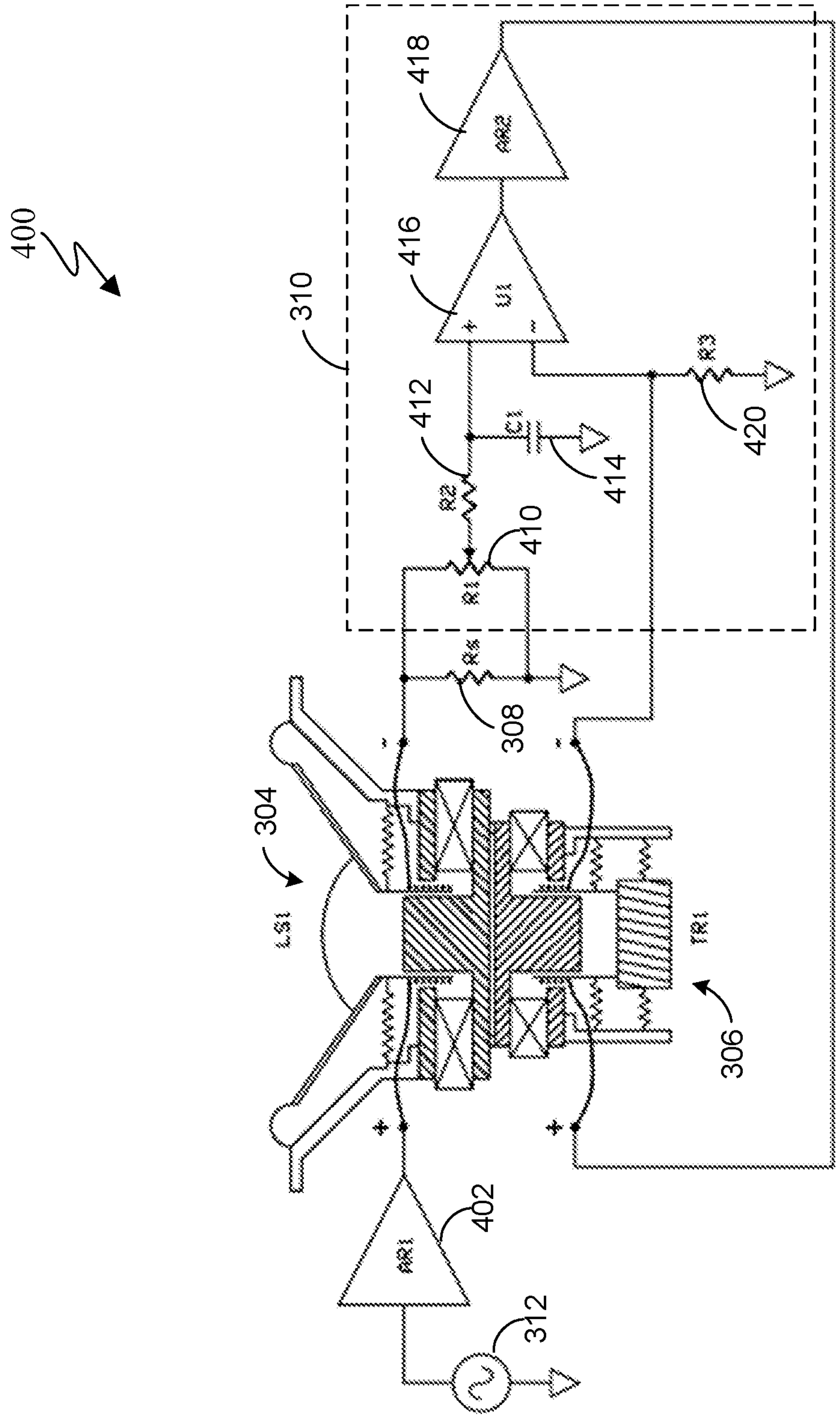
FIG. 4 illustrates an exemplary schematic diagram of a loudspeaker with analog signal processing circuitry according to embodiments of the present disclosure.

FIG. 4 illustrates an exemplary schematic diagram 400 of a loudspeaker with analog signal processing circuitry which is an embodiment of the present invention. The embodiment of the loudspeaker 400 illustrated in FIG. 4 is for illustration only. FIG. 4 does not limit the scope of this disclosure to any particular implementation of a loudspeaker.

The circuit of FIG. 4 illustrates one implementation of the voltage controlled current source 310 in FIG. 3B. A loudspeaker power amplifier AR1 402 (not shown in FIG. 3B) is connected between the power source 312 and the loudspeaker LS1 304, amplifying the power supply driving signal applied to the loudspeaker LS1 304. The loudspeaker current sense resistor Rs 308 connected between the loudspeaker LS1 304 and ground corresponds to the sense resistor Rs 308 shown in FIG. 3, and produces a voltage proportional to the current through the loudspeaker LS1 304.

A current sense level potentiometer R1 410, low pass filter resistor R2 412 and low pass filter capacitor C1 414, current source operational amplifier U1 416, actuator power amplifier AR2 418, and actuator current sense resistor R3 420 form the voltage controlled current source 310 of FIG. 3B. The current sense level potentiometer R1 410 provides a voltage drop proportional to the voltage caused by the current through the loudspeaker LS1 304, which is substantially the same as the current through the current sense resistor Rs 308 when the current sense level potentiometer R1 410 has a resistance much larger (e.g., at least one order of magnitude) than the resistance of the current sense resistance Rs 408. That voltage drop across the current sense level potentiometer R1 410 is filtered for high frequency transients using a low pass filter formed by low pass filter resistor R2 412 and low pass filter capacitor C1 414, which are connected to the non-inverting input of current source operational amplifier U1 416. The inverting terminal of the current source operational amplifier U1 416 is grounded through an actuator current sense resistor R3 420. The current source operational amplifier U1 416 thus produces an output current proportional to the voltage across the current sense resistance Rs 408 (and across the current sense level potentiometer R1 410), by a factor determined by a resistance of the actuator current sense resistor R3 420. The current output of the current source operational amplifier U1 416 is amplified by the actuator power amplifier AR2 418 to produce a current signal suitable for driving the actuator TR1 306.

Although FIG. 4 illustrates an example loudspeaker 400 with an actuator driven in series, various changes may be made to FIG. 4. For example, the number and placement of various components of the loudspeaker 400 can vary as needed or desired. In addition, the loudspeaker 400 may be used in any other suitable loudspeaker process and is not limited to the specific processes described above.

Figure 5:
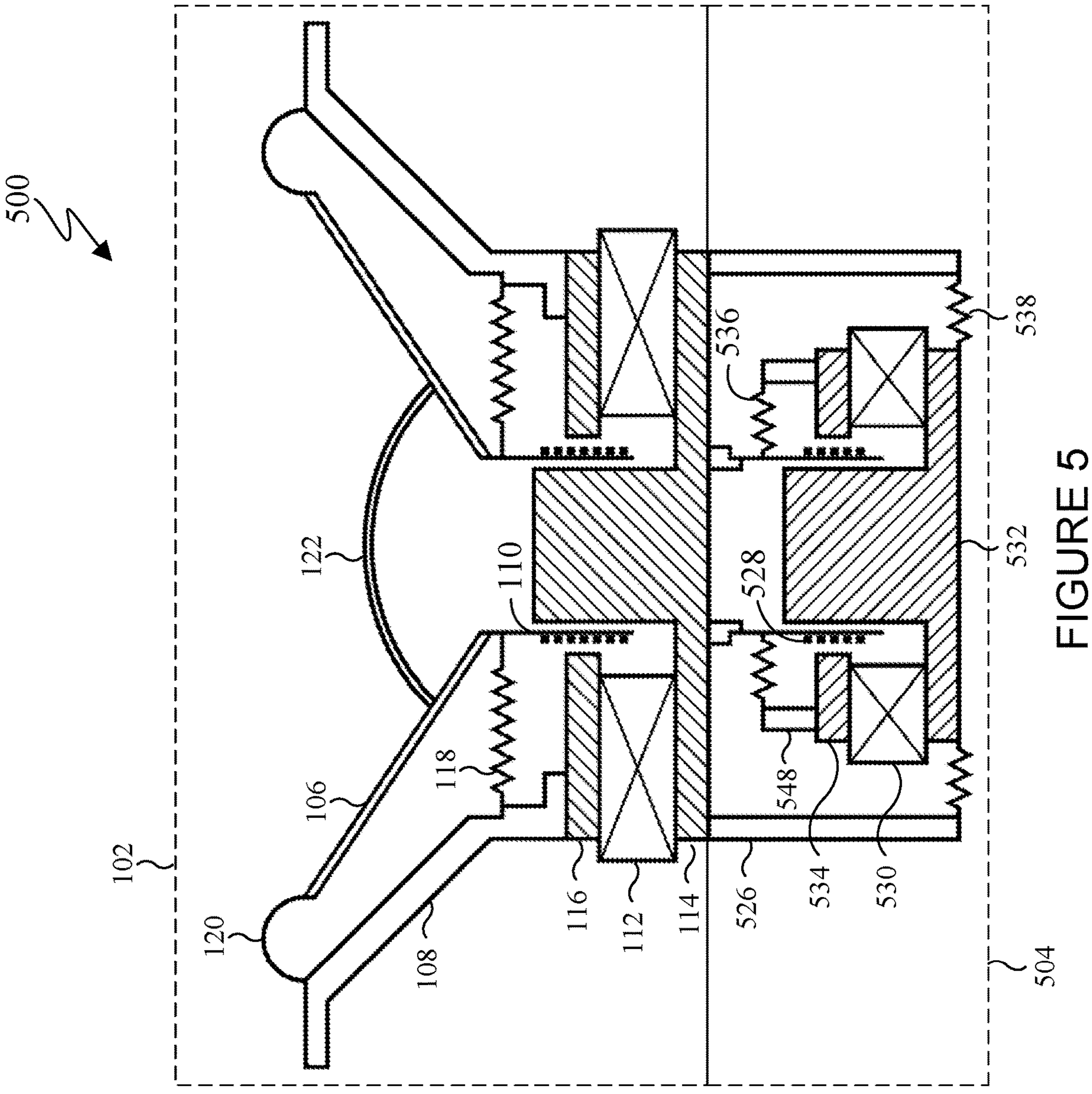
FIG. 5 illustrates an exemplary diagram for a loudspeaker with an actuator driven in series according to embodiments of the present disclosure.

FIG. 5 illustrates an exemplary diagram for a loudspeaker with an actuator driven in series according to embodiments of the present disclosure.

A dynamic loudspeaker 500 can include an acoustic assembly 102 and a reaction assembly 504. The reaction assembly 504 can also be referred to as an actuator. The acoustic assembly 102 includes components of the loudspeaker 500 used to produce an audio output. The acoustic assembly 102 can include a diaphragm 106, a basket 108, a voice coil 110, an acoustic magnet 112, an acoustic yoke 114, acoustic front plate 116, a spider 118, and a surround 120, and a cap 122. These components are previously discussed in detail above.

When the acoustic force 140 is applied to the diaphragm 106, a reaction force 142 is applied in an opposite direction. As discussed previously, the reaction force 142 can cause undesirable vibrations that may decrease a quality of the sound produce by the diaphragm 106. The reaction assembly 504 generates a response force 146 to counter the reactive force. The reaction assembly 504 can include first supporting plates 526, a reactive coil 528, a reactive magnet 530, a reactive yoke 532, a reactive front plate 534, a first mass dampeners 536, a second mass dampeners 538, and second supporting plates 548.

The hi 504 essentially cancels an actuator force 144 generated by a loudspeaker motor by moving a reactive yoke 532, the reactive magnet 530, the reactive front plate 534, and the second supporting plates. These movement of these components will be simplified by discussing movement of the reactive yoke 532. The reactive yoke 532 is moved in the opposite direction of the diaphragm 106 with the intention of canceling out the reaction force 142 exerted by the diaphragm 106 on the motor. The reactive yoke 532 can be connected at a first end to the first supporting plates 526 and at a second end to a reactive coil 528. Characteristics of the reactive yoke 532 are designed to produce a response force 146 that equals the reaction force 142 produced. The reactive yoke 532 can be formed from any suitable material(s). In some embodiments, the reactive yoke 532 can be formed from iron or lead, or other material(s) that can have a large specific gravity in order to enhance prevention of sounds from the reactive yoke 532.

The first supporting plates 526 is a frame that provides a support structure for the reaction assembly 504. The first supporting plates 526 is attached to a speaker case, basket 108, or other structural component in which the loudspeaker 500 is installed. The components of the reaction assembly 504 are mounted to the first supporting plates 526. The first supporting plates 526 provides a rigid structure that is made with a high degree of precision for all the components of the loudspeaker 500 to align properly. The first supporting plates 526 can provide additional functionality, such as heat dissipation from other components. The first supporting plates 526 can be made of any suitable material(s) for minimizing additional vibration cause by the reactive yoke 532. In some embodiments, the first supporting plates 526 can be formed from stamped steel, cast aluminum, plastic, or other material(s) that can properly be designed for proper alignment of the other components of the loudspeaker 500 and also minimize vibration in the first supporting plates 526 due to the connection with the reactive yoke 532. The first supporting plates 526 can be formed of the same material or a different material as the basket 108.

The reactive coil 528 is a coil of wire that receives an alternating flowing current of an audio signal which creates an electromagnetic field through the reactive coil 528. The electromagnetic field of the reactive coil 528 counters a permanent magnetic field created by the reactive magnet 530. The countering of the permanent magnetic field by the electromagnetic field causes vibration in the reactive coil 528 and the reactive yoke 532. The actuator force 144 exerted on the reactive yoke 532 is generated by a motor assembly that passes current through the reactive coil 528 situated in a static magnetic field generated by the reactive magnet 530. The acoustic force 540 exerted on the reactive yoke 532 is equal to the current in the reactive coil 528 times the magnetic field strength generated by the reactive magnet 530 times the length of reactive coil 528 within the magnetic field.

While a single reactive coil 528 is described, multiple reactive coils 528 could be implemented in the reaction assembly 504 for providing various wiring options and providing an ability of simultaneously connecting two different signals. Note that while the reactive coil 528 is described as being underhung, the reactive coil 528 may be integrated as overhung in the loudspeaker 500. The reactive coil 528 can be formed of any suitable material for creating a wire that converts an alternating flowing current into an electromagnetic field. In some embodiments, the reactive coil 528 can be formed of copper, aluminum, or any other material(s) that convert an alternating current into an electromagnetic field. The reactive coil 528 can be formed from the same or different material as the voice coil 110.

The reactive magnet 530, reactive yoke 532, and reactive front plate 534 cumulatively generate the permanent static magnetic field for the reaction assembly 504. The reactive magnet 530 provides a stationary magnetic field to oppose the alternating electromagnetic field of the reactive coil 528. As discussed above, the opposing fields cause the reactive yoke 532 to move inward and outward. The reactive magnet 530 can be any shape and size. In certain embodiments the reactive magnet 530 can be in a ring shape. The reactive magnet 530 can be made of any suitable material(s). In some embodiments, the reactive magnet 530 can be made from a ferrous ceramic material or other material(s) for generating a stationary magnetic field. The reactive magnet 530 can be formed from the same or different material(s) and shape as the acoustic magnet 112.

The second supporting plates 548 is a frame that provides a support structure for the reaction assembly 504. The second supporting plates 548 is attached to a reactive front plate 534. The second supporting plates 548 can provide additional functionality, such as heat dissipation from other components. The second supporting plates 548 can be made of any suitable material(s) for minimizing additional vibration cause by the reactive yoke 532. In some embodiments, the first supporting plates 526 can be formed from stamped steel, cast aluminum, plastic, or other material(s) that can properly be designed for proper alignment of the other components of the loudspeaker 500 and also minimize vibration in the first supporting plates 526 due to the connection with the reactive yoke 532. The second supporting plates 548 can be formed of the same material or a different material as the basket 108 and the first supporting plates 526.

The first mass dampeners 536 and the second mass dampeners 538 collectively form a suspension for the reactive yoke 532. The first mass dampeners 536 connects between an inner side of the reactive coil 528 support and the second supporting plates 548. The second mass dampeners 538 connects between an outside side of the reactive yoke 532 and the first supporting plates 526. The suspension centers the reactive coil 528 in the gap of the magnetic circuit in both the axial and radial directions. The suspension provides a restoring force to maintain a position of the reactive coil 528 in the gap, limiting undesirable movement of the reactive yoke 532 and the reactive coil 528. The first mass dampeners 536 can be made of any suitable material(s) manufactured to not encourage movement in any one direction and provide homogenous movement of the reactive coil 528. In some embodiments, the first mass dampeners 536 can be formed of a fabric impregnated with a stiffening resin or other suitable material(s) that favor controlled damping. The second mass dampeners 538 can be formed as part of the reactive yoke 532 or as a separate component. In embodiments where the second mass dampeners 538 is a separate component, the second mass dampeners 538 can be formed of a same or similar material(s) as the reactive yoke 532 or can be formed of different material(s) that would provide suitable suspension of the reactive yoke 532. The first mass dampeners 536 and the second mass dampeners 538 can be formed of the same or different material(s) as the spider 118.

Although FIG. 5 illustrates an example loudspeaker 500 with an actuator driven in series, various changes may be made to FIG. 5. For example, the number and placement of various components of the loudspeaker 500 can vary as needed or desired. In addition, the loudspeaker 500 may be used in any other suitable loudspeaker process and is not limited to the specific processes described above.

Figure 6:
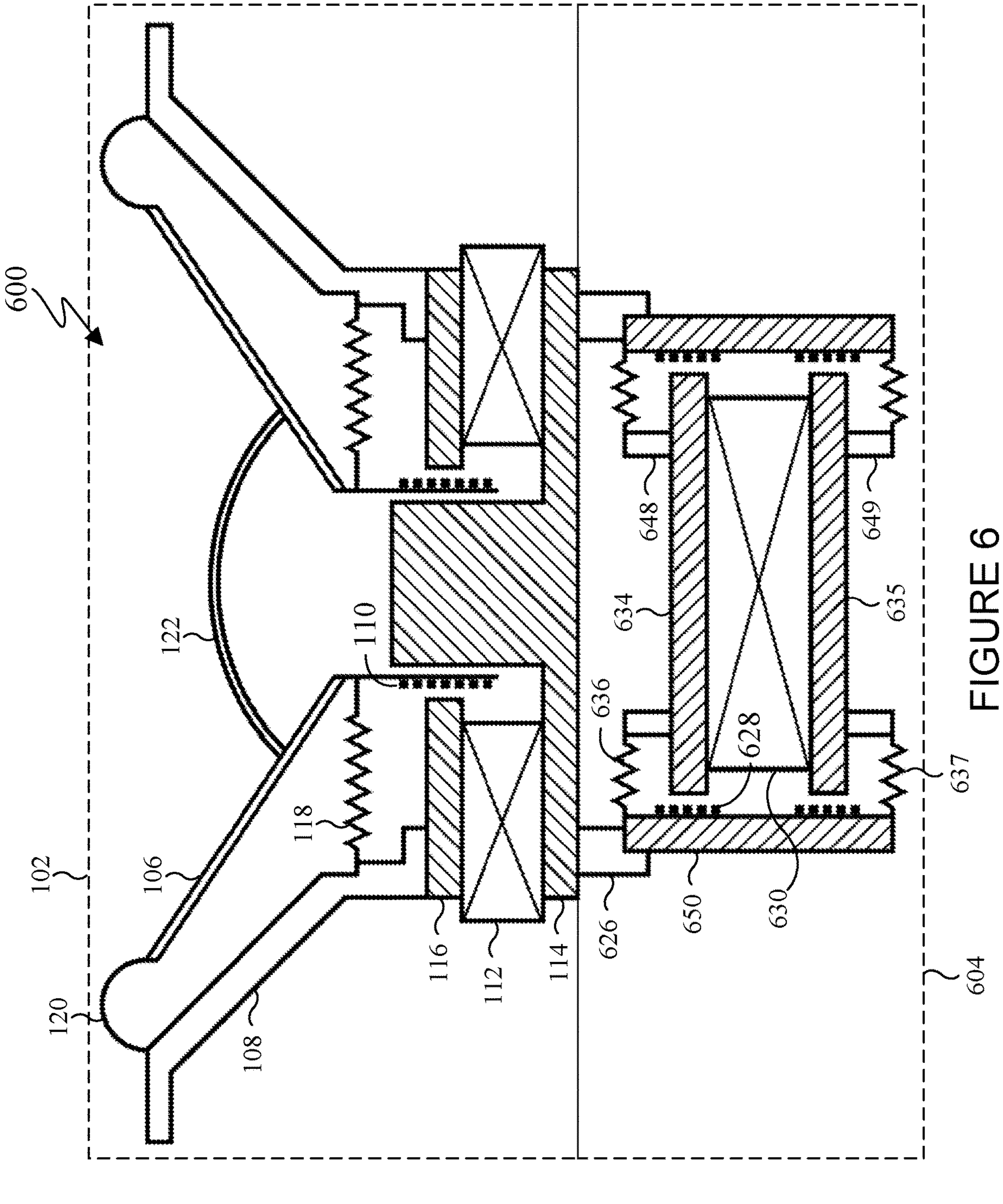
FIG. 6 illustrates an exemplary diagram for a loudspeaker with an actuator driven in series according to embodiments of the present disclosure.

FIG. 6 illustrates an exemplary diagram for a loudspeaker with an actuator driven in series according to embodiments of the present disclosure.

A dynamic loudspeaker 600 can include an acoustic assembly 102 and a reaction assembly 604. The reaction assembly 604 can also be referred to as an actuator. The acoustic assembly 102 includes components of the loudspeaker 600 used to produce an audio output. The acoustic assembly 102 can include a diaphragm 106, a basket 108, a voice coil 110, an acoustic magnet 112, an acoustic yoke 114, acoustic front plate 116, a spider 118, a surround 120, and a cap 122. These components are previously discussed in detail above.

When the acoustic force is applied to the diaphragm 106, a reaction force 142 is applied in an opposite direction. As discussed previously, the reaction force 142 can cause undesirable vibrations that may decrease a quality of the sound produce by the diaphragm 106. The reaction assembly 604 generates a response force 146 to counter the reactive force. The reaction assembly 604 can include first supporting plates 626, a reactive coil 628, a reactive magnet 630, a first reactive front plate 634, a second reactive plate 635, a first mass dampeners 636, a second mass dampeners 637, second supporting plates 648, third supporting plates 649, and cylinder 650.

The cylinder 650 can support the "mass" of reaction assembly 604, which can include the first reactive front plate 634, the second reactive plate 635, the first mass dampeners 636, the second mass dampeners 637, the second supporting plates 648, and the third supporting plates 649. The cylinder 650 can be coupled to the first supporting plates 626. The cylinder 650 can provide additional functionality, such as heat dissipation from other components. The cylinder 650 can be made of any suitable material(s) for minimizing additional vibration cause by the mass. In some embodiments, the cylinder 650 can be formed from stamped steel, cast aluminum, plastic, or other material(s) that can properly be designed for proper alignment of the other components of the loudspeaker 600 and also minimize vibration in the cylinder 650 due to the connection with the mass.

The reaction assembly 604 essentially cancels an actuator force 144 generated by a loudspeaker motor by moving a mass, which includes the first reactive front plate 634, the second reactive plate 635, the first mass dampeners 636, the second mass dampeners 637, the second supporting plates 648, and the third supporting plates 649. The mass is moved in the opposite direction of the diaphragm 106 with the intention of canceling out the reaction force 142 exerted by the diaphragm 106 on the motor. The mass can be connected at a first end to the first supporting plates 626 and at a second end to reactive coils 628. Characteristics of the mass are designed to produce a response force 146 that equals the reaction force 142 produced. The mass can be formed from any suitable material(s). In some embodiments, the mass can be formed from iron or lead, or other material(s) that can have a large specific gravity in order to enhance prevention of sounds from the mass.

The first supporting plates 626 is a frame that provides a support structure for the reaction assembly 604. The first supporting plates 626 is attached to a speaker case, basket 108, or other structural component in which the loudspeaker 600 is installed. The components of the reaction assembly 604 are mounted to the first supporting plates 626. The first supporting plates 626 provides a rigid structure that is made with a high degree of precision for all the components of the loudspeaker 100 to align properly. The first supporting plates 626 can provide additional functionality, such as heat dissipation from other components. The first supporting plates 626 can be made of any suitable material(s) for minimizing additional vibration caused by the mass. In some embodiments, the first supporting plates 626 can be formed from stamped steel, cast aluminum, plastic, or other material(s) that can properly be designed for proper alignment of the other components of the loudspeaker 600 and also minimize vibration in the first supporting plates 626 due to the connection with the mass 124. The first supporting plates 626 can be formed of the same material or a different material as the basket 108.

The reactive coils 628 is a coil of wire that receives an alternating flowing current of an audio signal which creates an electromagnetic field through the reactive coils 628. The electromagnetic field of the reactive coil 628 counters a permanent magnetic field created by the reactive magnet 630. The countering of the permanent magnetic field by the electromagnetic field causes vibration in the reactive coils 628 and the mass. The actuator force 144 exerted on the mass is generated by a motor assembly that passes current through the reactive coils 628 situated in a static magnetic field generated by the reactive magnet 630. The acoustic force 640 exerted on the mass is equal to the current in the reactive coils 628 times the magnetic field strength generated by the reactive magnet 630 times the length of reactive coils 628 within the magnetic field.

Note that while the reactive coils 628 are described as being underhung, the reactive coils 628 may be integrated as overhung in the loudspeaker 600. The reactive coils 628 can be formed of any suitable material for creating a wire that converts an alternating flowing current into an electromagnetic field. In some embodiments, the reactive coils 628 can be formed of copper, aluminum, or any other material(s) that convert an alternating current into an electromagnetic field. The reactive coils 628 can be formed from the same or different material as the voice coil 110.

The reactive magnet 630, reactive yoke 632, and first reactive front plate 634 cumulatively generate the permanent static magnetic field for the reaction assembly 604. The reactive magnet 630 provides a stationary magnetic field to oppose the alternating electromagnetic field of the reactive coils 628. As discussed above, the opposing fields cause the mass to move inward and outward. The reactive magnet 630 can be any shape and size. In certain embodiments the reactive magnet 630 can be in a ring shape. The reactive magnet 630 can be made of any suitable material(s). In some embodiments, the reactive magnet 630 can be made from a ferrous ceramic material or other material(s) for generating a stationary magnetic field. The reactive magnet 630 can be formed from the same or different material(s) and shape as the acoustic magnet 112.

The second supporting plates 648 form a frame that provides a support structure for the reaction assembly 604. The second supporting plates 648 are attached to a first reactive front plate 634. The second supporting plates 648 can provide additional functionality, such as heat dissipation from other components. The second supporting plates 648 can be made of any suitable material(s) for minimizing additional vibration cause by the mass. In some embodiments, the second supporting plates 648 can be formed from stamped steel, cast aluminum, plastic, or other material(s) that can properly be designed for proper alignment of the other components of the loudspeaker 600 and also minimize vibration in the second supporting plates 648 due to the connection with the mass 124. The second supporting plates 648 can be formed of the same material or a different material as the basket 108 and the first supporting plates 626.

The third supporting plates 649 form a frame that provides a support structure for the reaction assembly 604. The third supporting plates 649 are attached to the second reactive plate 635. The third supporting plates 649 can provide additional functionality, such as heat dissipation from other components. The third supporting plates 649 can be made of any suitable material(s) for minimizing additional vibration cause by the mass. In some embodiments, the third supporting plates 649 can be formed from stamped steel, cast aluminum, plastic, or other material(s) that can properly be designed for proper alignment of the other components of the loudspeaker 600 and also minimize vibration in the third supporting plates 649 due to the connection with the mass 124. The third supporting plates 649 can be formed of the same material or a different material as the basket 108, the first supporting plates 626, and the second supporting plates 648.

The first mass dampeners 636 and the second mass dampeners 637 collectively form a suspension for the mass. The first mass dampeners 636 connects between the first supporting plates 626 and the second supporting plates 648. The second mass dampeners 637 connects between the first supporting plates 626 and the third supporting plates 649. The suspension centers the reactive coils 628 in the gap of the magnetic circuit in both the axial and radial directions. The suspension provides a restoring force to maintain a position of the reactive coils 628 in the gap, limiting undesirable movement of the mass and the reactive coils 628. The first mass dampeners 636 can be made of any suitable material(s) manufactured to not encourage movement in any one direction and provide homogenous movement of the reactive coils 628. In some embodiments, the first mass dampeners 636 and second mass dampeners 637 can be formed of a fabric impregnated with a stiffening resin or other suitable material(s) that favor controlled damping. The first mass dampeners 636 and the second mass dampeners 637 can be formed of the same or different material(s) as the spider 118.

Although FIG. 6 illustrates an example loudspeaker 600 with an actuator driven in series, various changes may be made to FIG. 6. For example, the number and placement of various components of the loudspeaker 600 can vary as needed or desired. In addition, the loudspeaker 600 may be used in any other suitable loudspeaker process and is not limited to the specific processes described above.

Figure 7:
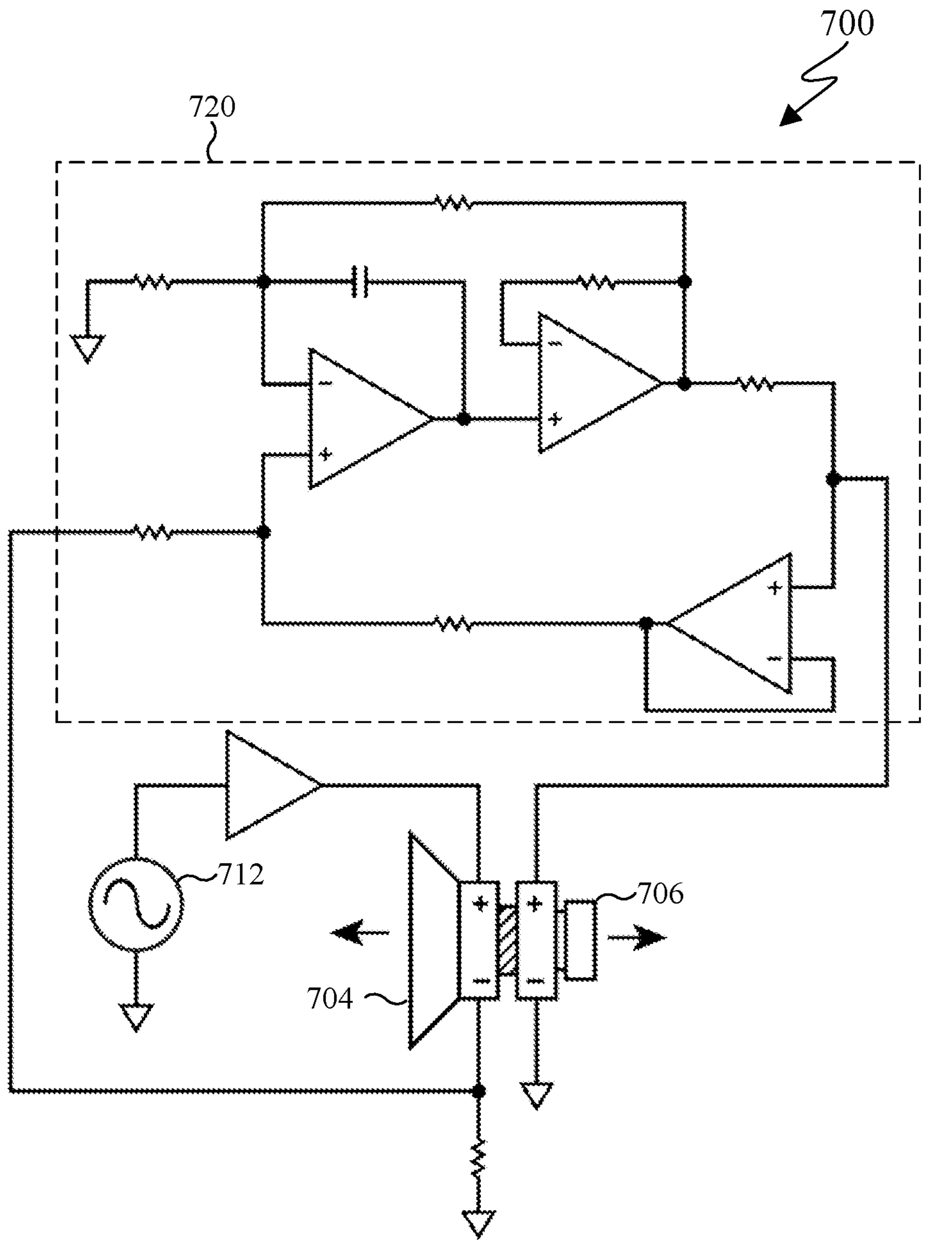
FIG. 7 illustrates a schematic diagram for a current source topology in a loudspeaker according to embodiments of the present disclosure.

FIG. 7 illustrates a schematic diagram for current source topology 700 in a loudspeaker according to embodiments of the present disclosure. As discussed above, the tuning issue can be reduced a degree by a power source 712 driving the actuator 706 in series with the loudspeaker 704. As shown in FIG. 7, an enhanced Howland current Source 720 can be used to measure the current and provide a proportional current to the actuator 706.

Although FIG. 7 illustrates an example current source topology 700, various changes may be made to FIG. 7. For example, the number and placement of various components of the current source topology 700 can vary as needed or desired. In addition, the current source topology 700 may be used in any other suitable loudspeaker process and is not limited to the specific processes described above.

Figure 8:
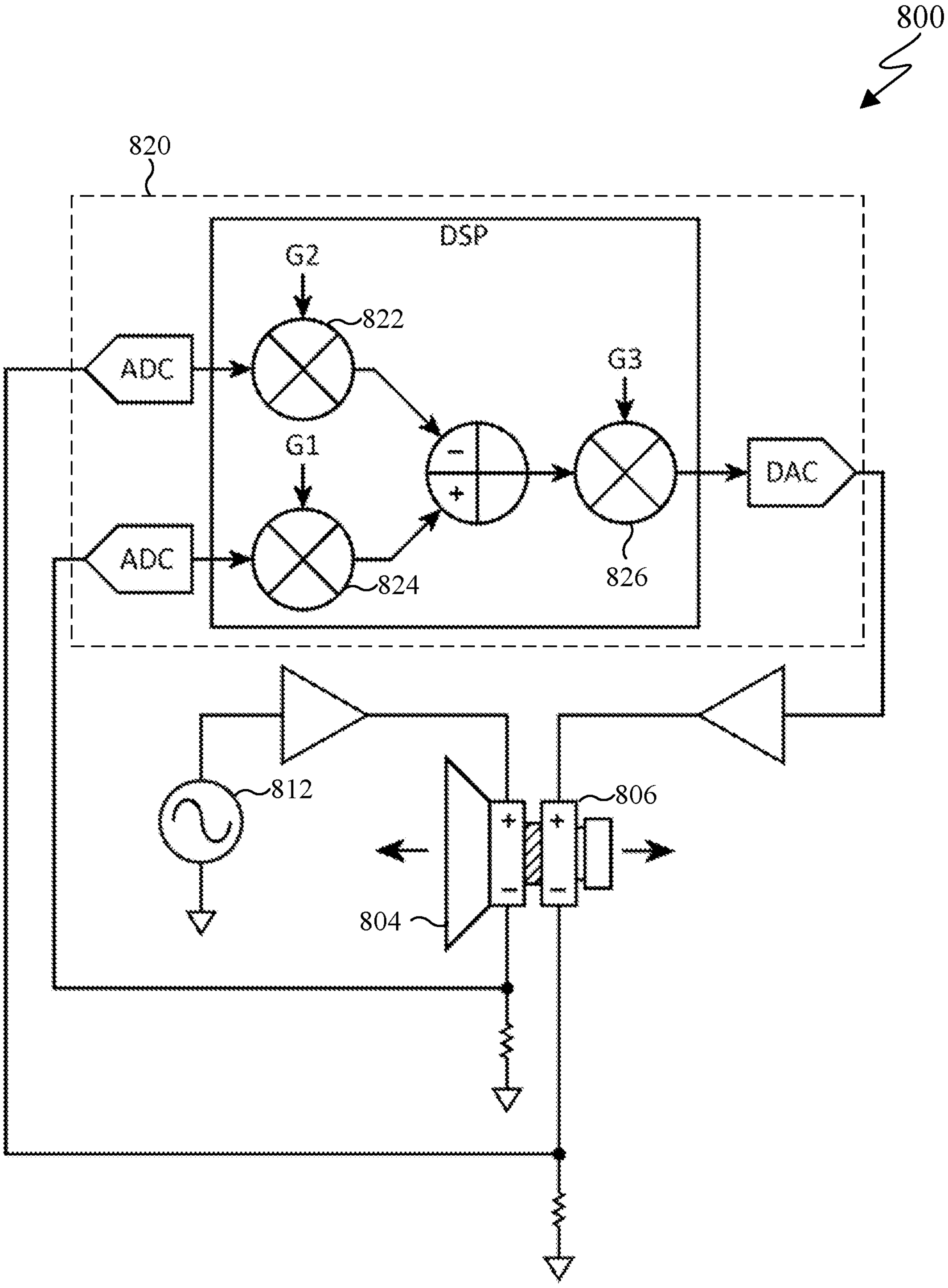
FIG. 8 illustrates a schematic diagram for current source topology in a loudspeaker according to embodiments of the present disclosure.

FIG. 8 illustrates a schematic diagram for current source topology 800 in a loudspeaker according to embodiments of the present disclosure. As discussed above, the tuning issue can be reduced a degree by a power source 812 driving the actuator 806 in series with the loudspeaker 804. As shown in FIG. 8, a digital signal processor algorithm 820 can be used to measure the current and provide a proportional current to the actuator 806. The digital signal processor algorithm 820 can include a loudspeaker current sense voltage input 822, an actuator current sense feedback gain 824, and an actuator control voltage output gain 826. The loudspeaker current sense voltage input 822 can detect the current voltage input to the loudspeaker 804. The actuator current sense feedback gain 824 can determine a proportional current to apply to the actuator 806. The actuator control voltage output gain 826 can apply the proportional current to the actuator 806.

Although FIG. 8 illustrates an example current source topology 800, various changes may be made to FIG. 8. For example, the number and placement of various components of the current source topology 800 can vary as needed or desired. In addition, the current source topology 800 may be used in any other suitable loudspeaker process and is not limited to the specific processes described above.

Figure 9:
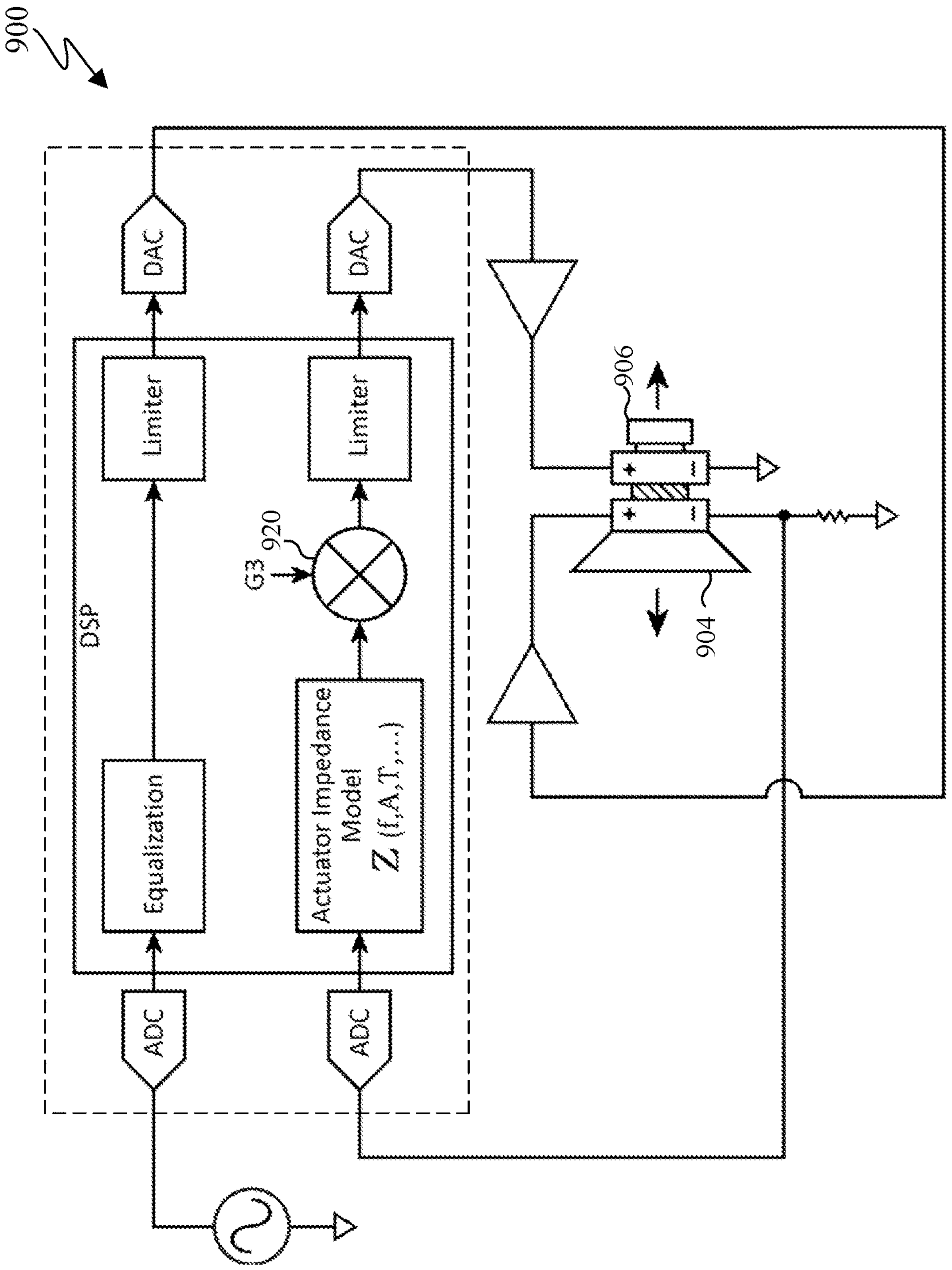
FIG. 9 illustrates a schematic diagram for current source topology in a loudspeaker according to embodiments of the present disclosure.

FIG. 9 illustrates a schematic diagram for current source topology 900 in a loudspeaker according to embodiments of the present disclosure. Unlike the loudspeaker 904, the actuator 906 can be housed entirely inside or outside of the speaker enclosure. When positioned inside or outside of the speaker enclosure, the actuator 906 can experience consistent acoustic loading because all sides of the reactive moving mass are contained within the same acoustic environment. This results in the electrical impedance response 200 of the actuator 906 being independent of the specific loudspeaker enclosure implementation (bass-reflex, sealed, etc.) and, therefore, relatively consistent and predictable. A feed-forward control topology where the impedance response 200 of the actuator is mathematically modeled is provided, which can include frequency, amplitude, temperature dependence as well as any other predicable parameter that affects the actuator 906. The mathematical impedance model filters the response of the control voltage derived from the loudspeaker current such the feed-forward output voltage causes the actuator current to be directly proportional to the loudspeaker current. A protection algorithm such as a voltage limiter to prevent over-excursion of the actuator can also be implemented. The current source topology 900 can include an actuator control voltage output gain 920. The actuator control voltage output gain 920 can control the voltage applied to the actuator 906 to cancel out the loudspeaker 904.

Although FIG. 9 illustrates an example current source topology 900, various changes may be made to FIG. 9. For example, the number and placement of various components of the current source topology 900 can vary as needed or desired. In addition, the current source topology 900 may be used in any other suitable loudspeaker process and is not limited to the specific processes described above.

Figure 10:
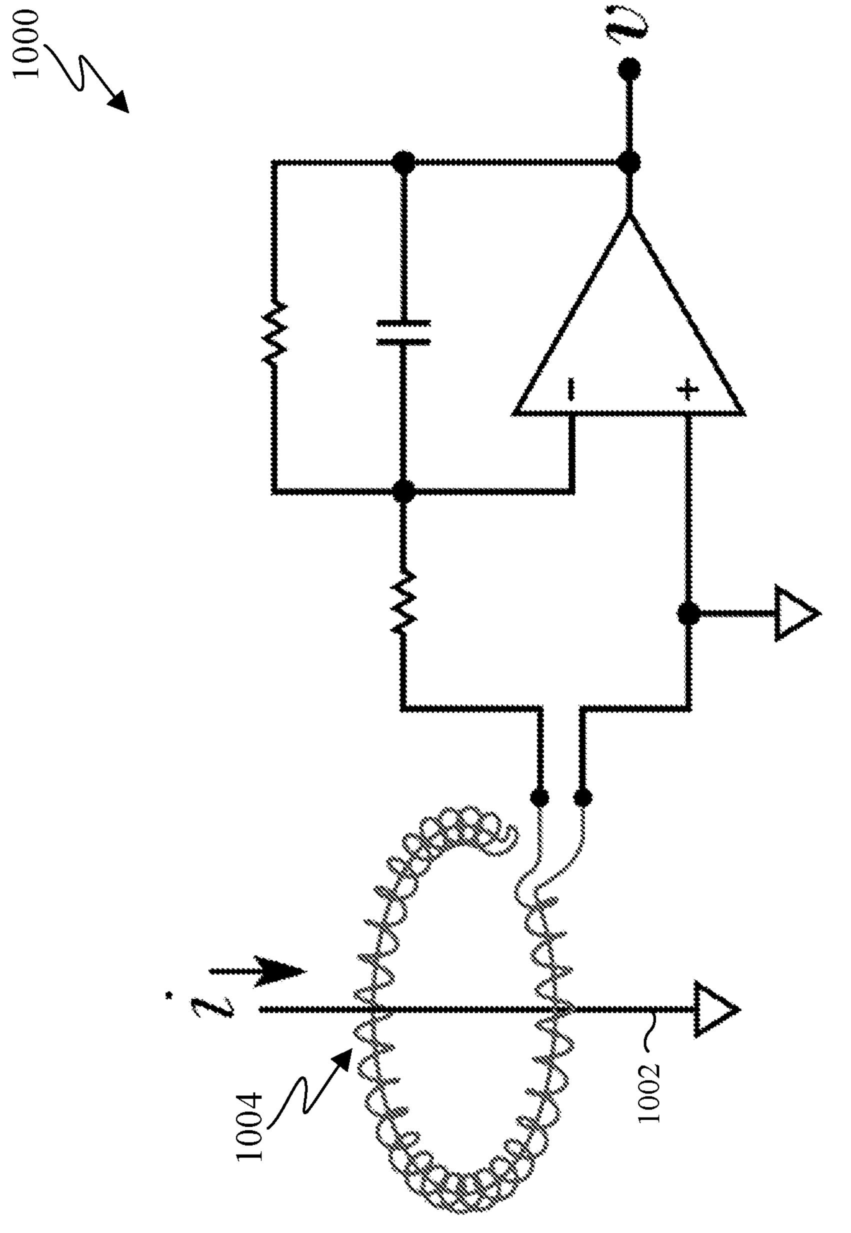
FIG. 10 illustrates an exemplary diagram for current measurements of a loudspeaker according to embodiments of the present disclosure.

FIG. 10 illustrates an exemplary diagram 1000 for current measurements of a loudspeaker according to embodiments of the present disclosure. As shown in FIG. 10, a wire 1002 carrying the current going through the loudspeaker can pass through a Rogowski coil 1004. The Rogowski coil 1004 can include a toroid around the wire 1002. The Rogowski coil 1004 can provide the voltage control to the current source. Likewise, a Rogowski coil 1004 can also be used to measure the actuator current to provide negative feedback to the current source.

Although FIG. 10 illustrates an example current measurement diagrams 1000, various changes may be made to FIG. 10. For example, the number and placement of various components of the current measurement diagrams 1000 can vary as needed or desired. In addition, the current measurement diagrams 1000 may be used in any other suitable loudspeaker process and is not limited to the specific processes described above.

Figure 11:
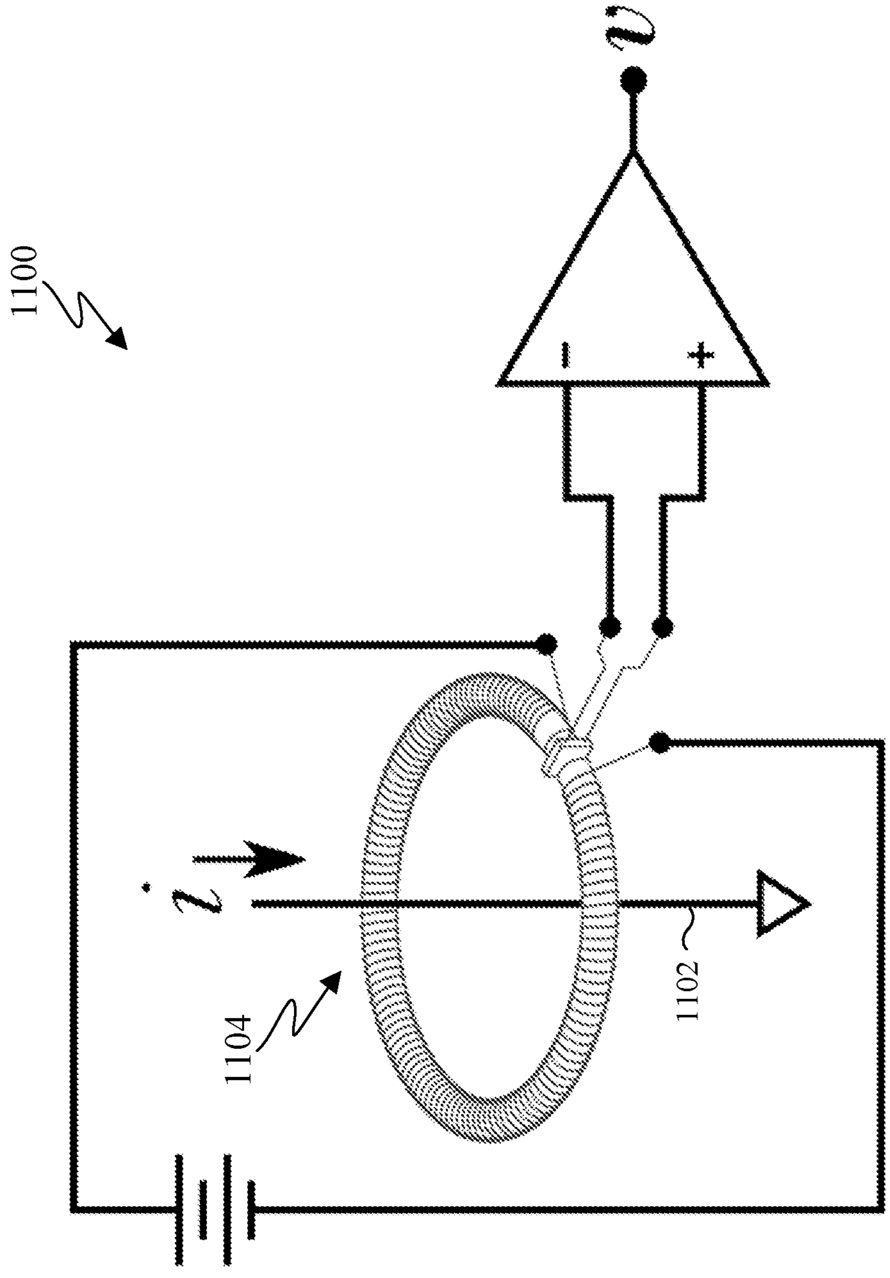
FIG. 11 illustrates an exemplary diagram for current measurements of a loudspeaker according to embodiments of the present disclosure.

FIG. 11 illustrates an exemplary diagram 1100 for current measurements of a loudspeaker according to embodiments of the present disclosure.

As shown in FIG. 11, the wire 1102 carrying the current going through the loudspeaker can pass through a Hall Effect current sensing loop 1104. The Hall Effect current sensing loop 1104 can provide a voltage control to the current source. Likewise, the Hall Effect current sensing loop 1104 can also be used to measure the actuator current to provide negative feedback to the current source.

Although FIG. 11 illustrates an example current measurement diagram 1100, various changes may be made to FIG. 11. For example, the number and placement of various components of the current measurement diagram 1100 can vary as needed or desired. In addition, the current measurement diagram 1100 may be used in any other suitable loudspeaker process and is not limited to the specific processes described above.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in this application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for reducing reaction forces in loudspeakers, the method comprising:

providing, from a power source connected to a loudspeaker, a current to the loudspeaker;

measuring, using a current sense resistance connected in series to the loudspeaker, the current through the loudspeaker; and providing, using a voltage-controlled source connected in series to the loudspeaker, a current substantially proportional to the measured current through the loudspeaker to an actuator, wherein the actuator is connected in series to the loudspeaker.

2. The method of claim 1, wherein the voltage-controlled source is in parallel to the current sense resistance.

3. The method of claim 1, wherein providing the current using the voltage-controlled source comprises:

providing, using a current sense level potentiometer, a voltage drop proportional to a voltage caused by a current through the loudspeaker.

4. The method of claim 3, wherein the current sense level potentiometer has a resistance at least one order of magnitude higher than the current sense resistance.

5. The method of claim 3, wherein providing the current using the voltage-controlled source further comprises:

filtering, using a low pass filter, high frequency transients of the voltage drop across the current sense level potentiometer.

6. The method of claim 5, wherein the low pass filter is formed by a low pass filter resistor and a low pass filter capacitor.

7. The method of claim 5, wherein providing the current using the voltage-controlled source further comprises:

producing, using a current source operational amplifier, an output current proportional to the voltage across the current sense resistance.

8. The method of claim 7, wherein the low pass filter is connected to a non-inverting input of the current source operational amplifier.

9. The method of claim 7, wherein:

an inverting terminal of the current source operational amplifier is connected to an actuator current sense resistor, and a factor for the output current proportional to the voltage across the current sense resistance is determined by a resistance of the actuator current sense resistor.

10. The method of claim 7, wherein providing the current using the voltage-controlled source further comprises:

amplifying, using an actuator power amplifier, the output current to produce the current that is suitable for driving the actuator.

11. An apparatus comprising:

a loudspeaker;

an actuator connected in series with the loudspeaker;

a power source connected to the loudspeaker to provide a current to the loudspeaker;

a current sense resistance connected in series to the loudspeaker to measure a current through the loudspeaker; and a voltage-controlled source connected in series to the loudspeaker to provide a current substantially proportional to the measured current through the loudspeaker to the actuator.

12. The apparatus of claim 11, wherein the voltage-controlled source is in parallel to the current sense resistance.

13. The apparatus of claim 11, wherein the voltage-controlled source comprises:

a current sense level potentiometer to provide a voltage drop proportional to a voltage caused by a current through the loudspeaker.

14. The apparatus of claim 13, wherein the current sense level potentiometer has a resistance at least one order of magnitude higher than the current sense resistance.

15. The apparatus of claim 13, wherein the voltage-controlled source further comprises:

a low pass filter to filter high frequency transients of the voltage drop across the current sense level potentiometer.

16. The apparatus of claim 15, wherein the low pass filter is formed by a low pass filter resistor and a low pass filter capacitor.

17. The apparatus of claim 15, wherein the voltage-controlled source further comprises:

a current source operational amplifier to produce an output current proportional to the voltage across the current sense resistance.

18. The apparatus of claim 17, wherein the low pass filter is connected to a non-inverting input of the current source operational amplifier.

19. The apparatus of claim 17, wherein:

an inverting terminal of the current source operational amplifier is connected to an actuator current sense resistor, and a factor for the output current proportional to the voltage across the current sense resistance is determined by a resistance of the actuator current sense resistor.

20. The apparatus of claim 17, wherein the voltage-controlled source further comprises:

amplifying, using a actuator power amplifier, the output current to produce the current that is suitable for driving the actuator.

* * * * *